United States Patent
Rabinovich et al.

(10) Patent No.: US 8,031,125 B2
(45) Date of Patent: Oct. 4, 2011

(54) ANTENNA AND SPLITTER FOR RECEIVING RADIO AND REMOTE KEYLESS ENTRY SIGNALS

(75) Inventors: Victor Rabinovich, Richmond Hill (CA); Yaroslaw Matkiwsky, Whitby (CA)

(73) Assignee: Flextronics Automotive Inc., Milpitas, CA (US)

( * ) Notice: Subject to any disclaimer, the term of this patent is extended or adjusted under 35 U.S.C. 154(b) by 0 days.

(21) Appl. No.: 12/878,069

(22) Filed: Sep. 9, 2010

(65) Prior Publication Data
US 2011/0080259 A1 Apr. 7, 2011

Related U.S. Application Data

(62) Division of application No. 11/819,771, filed on Jun. 29, 2007.

(51) Int. Cl.
*H01Q 1/32* (2006.01)
(52) U.S. Cl. .................................................. 343/712
(58) Field of Classification Search .......... 343/711–713, 343/702
See application file for complete search history.

(56) References Cited

U.S. PATENT DOCUMENTS

| | | | |
|---|---|---|---|
| 5,751,148 A * | 5/1998 | Kennedy et al. ............ 324/501 |
| 6,314,272 B1 * | 11/2001 | Adrian et al. ............. 455/67.12 |
| 6,431,712 B1 | 8/2002 | Turnbull |
| 6,657,536 B1 * | 12/2003 | Avenel ...................... 340/5.61 |
| 6,690,329 B2 | 2/2004 | Kodama |
| 6,697,024 B2 | 2/2004 | Fuerst et al. |
| 6,965,655 B1 * | 11/2005 | Mostov et al. .............. 375/345 |
| 7,038,630 B1 | 5/2006 | Bally et al. |
| 7,132,988 B2 | 11/2006 | Yegin et al. |
| 7,609,216 B2 | 10/2009 | Yegin et al. |
| 7,650,127 B2 * | 1/2010 | Baumgartner et al. .... 455/234.1 |
| 2002/0119761 A1 * | 8/2002 | Matsumoto ................. 455/140 |
| 2003/0071716 A1 * | 4/2003 | Adrian et al. ............... 340/5.6 |
| 2006/0022881 A1 | 2/2006 | Yegin et al. |
| 2007/0120754 A1 | 5/2007 | Mondadori et al. |

FOREIGN PATENT DOCUMENTS

| | | |
|---|---|---|
| WO | WO/01/01512 | 1/2001 |
| WO | WO/2004/103773 | 12/2004 |

OTHER PUBLICATIONS

Al-Khateeb et al, "Compact Planar Antennas for Short-Range Wireless Automotive Communication", IEEE Transactions on Vehicular Technology, vol. 55, No. 4, Jul. 2006.

\* cited by examiner

*Primary Examiner* — Huedung Mancuso
(74) *Attorney, Agent, or Firm* — Patton Boggs LLP

(57) ABSTRACT

An antenna system may include a first antenna having a helical shaped portion, and configured to receive signals over a first frequency range. A second antenna may be positioned in proximate distance from the first antenna, and be configured to receive signals over a second frequency range. A splitter may be configured for separating signals received from radio and remote keyless entry antennas and may include a first branch including a first filter to filter AM band signals from communications signals received from an antenna, a second branch including a second filter to filter FM band signals from communications signals received from the antenna, a third branch including a third filter to filter remote keyless entry signals from communications signals received from the antenna, and an amplifier to amplify the remote keyless entry signals. The filters may be passive filters. The antenna may be a whip antenna or roof antenna.

4 Claims, 19 Drawing Sheets

ANTENNA AND SPLITTER FOR RECEIVING RADIO AND REMOTE KEYLESS ENTRY SIGNALS

RELATED APPLICATIONS

This application is a division of application Ser. No. 11/819,771 filed Jun. 29, 2007.

BACKGROUND

Remote keyless entry systems for vehicles are used to provide operators the ability to remotely lock and unlock doors, to provide an extended communication range to start a vehicle engine, among other functions. To accommodate the remote keyless entry system, an antenna to receive remote keyless entry signals is located in a vehicle. Because vehicle manufacturers are concerned about parts count, size, and cost of components in production vehicles, the vehicle manufacturers desire to consolidate components wherever possible to reduce costs and weight, and to save space in the vehicle.

Consolidating antennas in vehicles has routinely been performed for receiving radio frequency bands, including AM and FM bands. There are many types of antennas, where different antenna types are used for different frequency bands. Whip antennas, which are typically stiff but flexible wire antennas, are usually vertically mounted, monopole antennas and configured to receive for AM/FM band signals.

Remote keyless entry (RKE) systems generally use antenna types other than whip antennas since the frequencies over which the remote keyless entry systems operate are different from the AM/FM band signals. The AM band operates between approximately 530 KHz and approximately 1710 KHz. The FM band operates between approximately 88 MHz and approximately 108 MHz. RKE frequencies operate between approximately 315 MHz and 433.92 MHz, but are generally centered at approximately 315 MHz and 433.92 MHz. Quality of AM/FM/RKE signals received is directly related to the design of the different antennas used to receive the signals.

In addition to the antenna design having an impact in the quality of the received signals, so too does a splitter used to split the signals received from the antenna(s) being communicated to a radio and RKE system. Because FM and RKE signals operate at RF frequencies in the hundreds of MHz range, the splitter can affect receiving performance of FM and RKE signals if not properly matched to the frequency bands of the respective signals.

SUMMARY

To address the concerns of the automotive industry, the principles of the present invention provide for an antenna unit including a first antenna configured to receive radio signals in both FM and AM bands and a second antenna configured to receive remote keyless entry signals over a frequency band at which RKE signals are communicated. In one embodiment, the radio antenna is a helical antenna and the RKE antenna is a stub antenna that is positioned a proximate distance from the radio antenna. In one embodiment, the proximate distance between the antennas may range between approximately 2 mm and 4 mm. The RKE antenna may have an alternative configuration, such as a helical shape or meandering shape, both optionally disposed on a printed circuit board.

One embodiment includes an antenna system, including a first antenna having a helical shaped portion, and configured to receive signals over a first frequency range, and a second antenna positioned in proximate distance from the first antenna, and configured to receive signals over a second frequency range. In one embodiment, the second antenna is a stub antenna. Alternatively, the second antenna may have a helical or meandering shape.

Another embodiment may include a method for manufacturing an antenna. A first antenna may be constructed having a helical portion, and configured to receive signals over a first frequency range. A second antenna may be constructed in a configuration to receive signals over a second frequency range. The second antenna may be positioned in proximate distance from the first antenna. In one embodiment, the proximate distance of the two antennas is between approximately 2 mm and 4 mm.

To further address the concerns of the automotive signal industry, the principles of the present invention provide for a splitter that may include passive filters for AM band, FM band, and RKE signals. An active amplifier may amplify the filtered RKE signal. The splitter may be incorporated into a base of a roof antenna, into a cable that connects to the antenna configured to receive each of the signals or into an RKE control module, for example.

One embodiment of a splitter for separating signals received from radio and remote keyless entry antennas may include a first branch including a first filter to filter AM band signals from communications signals received from an antenna, a second branch including a second filter to filter FM band signals from communications signals received from the antenna, a third branch including a third filter to filter remote keyless entry signals from communications signals received from the antenna, and an amplifier to amplify the remote keyless entry signals. The first and second filters may be passive filters. The antenna may be a whip antenna. A roof antenna may alternatively be utilized. In one embodiment, amplifiers may be used to amplify the filtered AM and FM frequency band signals when using a roof antenna.

An embodiment for receiving signals at a vehicle may include receiving, at an antenna system of a vehicle, a first radio signal within a first frequency range, a second radio signal within a second frequency range, and a remote keyless entry signal with a third frequency range. Each of the first radio signal, second radio signal, and remote keyless entry signal may be communicated from the antenna system to first, second and third communications paths of an electronic splitter. Filtering may occur along the first communications path to pass the first radio signal, along the second communications path to pass the second radio signal, and along the third communications path to pass the remote keyless entry signal. The filtered remote keyless entry signal may be amplified. The filtered first and second radio signal may be communicated to a radio, and the filtered remote keyless entry signal may be communicated to a remote keyless entry system to cause doors of the vehicle to be remotely locked and unlocked.

BRIEF DESCRIPTION OF THE DRAWINGS

Illustrative embodiments of the present invention are described in detail below with reference to the attached drawing figures, which are incorporated by reference herein and wherein.

DETAILED DESCRIPTION

Figure 1:
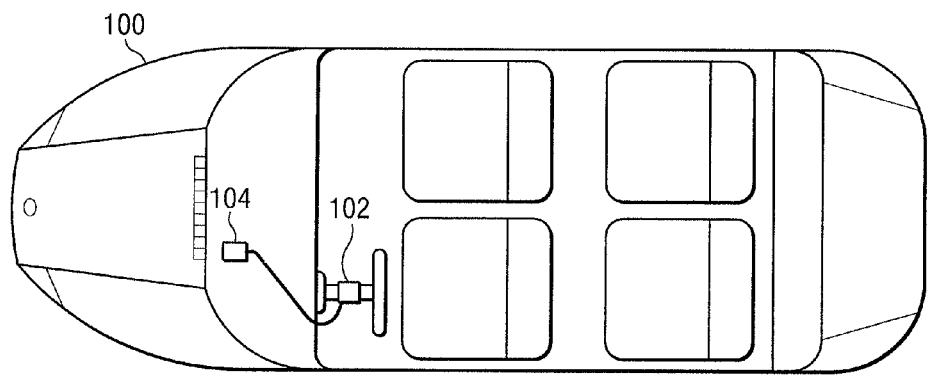
FIG. 1 is an illustration of an exemplary vehicle including an exemplary configuration of an antenna and RFE control module.

FIG. 1 is an illustration of an exemplary vehicle 100 including an exemplary configuration of an antenna 102 and RFE control module 104. The antenna 102 may be formed of one or more antennas to receive radio frequency (RF) signals over AM and FM frequency bands and another antenna to receive RKE signals over an RKE frequency band.

Figure 2:
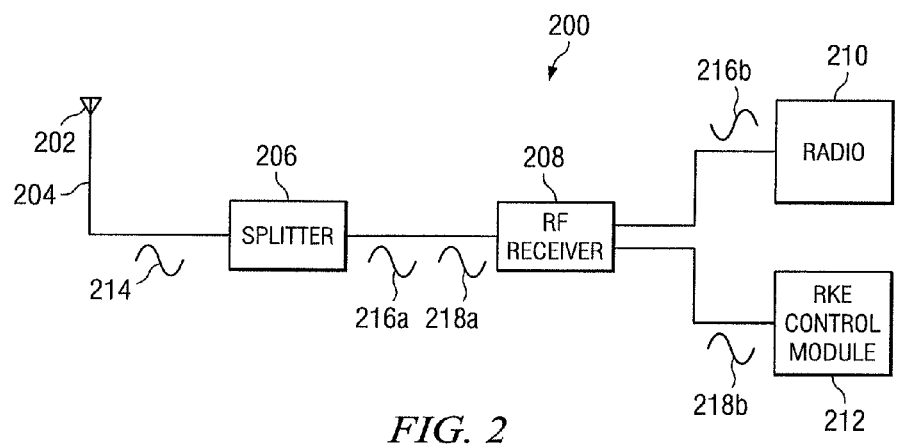
FIG. 2 is an illustration of an exemplary system configured to receive radio and RKE signals.

FIG. 2 is an illustration of an exemplary system 200 configured to receive radio and RKE signals. The system 200 may include an antenna 202, RF cable 204, and electronic splitter 206. In one embodiment, the splitter 2006 may be integrated into the RF cable 204 or configured into a base (not shown) of the antenna 202, for example. The system 200 may further include an RF receiver 208, radio 210, and RKE control module 212, as understood in the art.

In operation, the antenna 202 may be configured to receive AM, FM and RKE band signals 214 and communicate the signals via the RF cable 204 to the splitter 206. The splitter 206 may be configured to separate the signals over each RF frequency band, including radio signals 216a and 218a, and communicate the different signals to the RF receiver 208. The RF receiver 208 may be configured to demodulate the different RF signals and communicate the demodulated RF signals 216b and 218b to the radio 210 and RKE control module 212, respectively. In one embodiment, the RKE signals 218b may be digital data that is communicated to the RKE control module 212 to cause the RKE control module to lock and unlock doors of the vehicle, for example.

Figure 3:
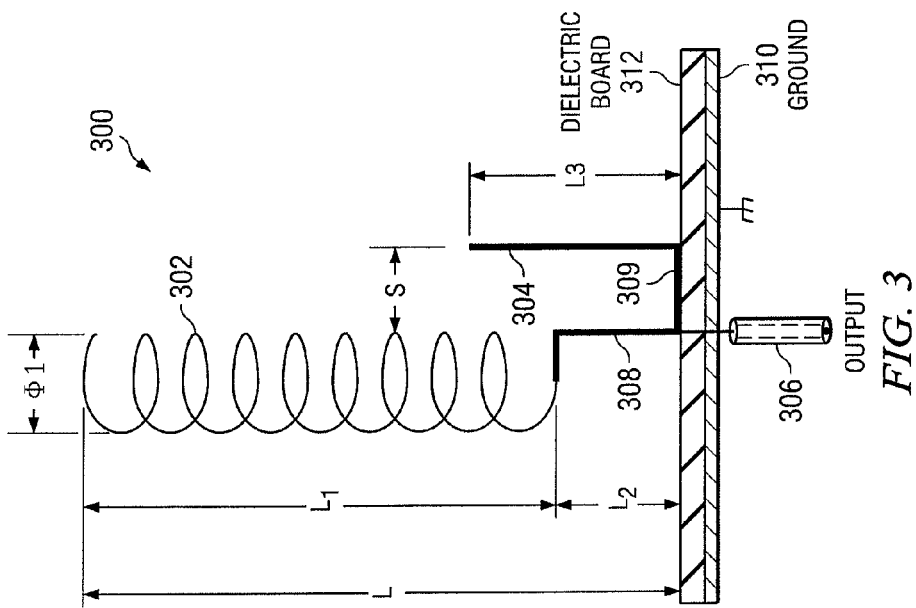
FIG. 3 is an illustration of an exemplary antenna configured to receive AM, FM, and RKE band signals.

FIG. 3 is an illustration of an exemplary antenna 300 configured to receive AM, FM, and RKE frequency band signals. A first antenna 302 may have a helix or helical shape. The antenna 302 may have a diameter ø1 and length L1 for use in receive AM and FM frequency band signals. In one embodiment, the length L1 is between approximately 18 cm and approximately 50 cm and diameter ø1 is between approximately 0.5 cm and approximately 1.0 cm. The first antenna 302 may further include a stub antenna 304 that is proximately positioned (i.e., closely positioned in distance) from the helical antenna 302 at a separation distance of S. In one embodiment, the stub antenna 304 (i) has a linear configuration, (ii) is metal in composition, (iii) has a length L3 between approximately 5 cm and approximately 10 cm, (iv) is positioned in parallel to the helical antenna 302, and has a separation distance S between approximately 2 mm and approximately 4 mm from the helical antenna 302. As understood in the art, RF coupling between proximately spaced antennas 302 and 304 may affect tuning of each individual antenna. Therefore, while the antenna parameters described above may be used as a tri-band antenna to receive AM band, FM band, and RKE band signals, other parameter variations, such as length and diameter, of the helical antenna 302, stub antenna 304, and distance between the antennas may be utilized to operate as a tri-band antenna to receive the radio and RKE band signals.

As further shown in FIG. 3, the helical antenna 302 and stub antenna 304 are connected to a common output 306. The helical antenna 302 has a linear output portion 308 having a length L2 between approximately 3 cm and 6 cm. The stub antenna 304 includes an output portion 309 that connects to the linear output portion 308 of the helical antenna 302 and is perpendicular to each of the antennas 302 and 304. Although the antenna 300 is characterized as including two antennas, the helical antenna 302 and stub antenna 304, the two antennas 302 and 304 operate as two antenna portions that receive signals over different frequencies. The antenna 302 may have a common output 306 or separate outputs, as shown in FIG. 4.

The antenna 300 further includes a ground plane 310 with a dielectric board 312 disposed thereon. In one embodiment, the dielectric board 312 may be composed of FR-4 material and have a thickness of approximately 1.6 mm. It should be understood that the configuration of the outputs 308 and 309 of respective antennas 302 and 304 may have alternative configurations and the dielectric board may be composed of another material and have a different thickness and provide an operable tri-band antenna solution.

As understood in the art, physical parameters of an antenna are used for adjusting bandwidth to receive signals over a frequency band for tuning impedance of the antenna over the frequency band, and for adjusting gain over the bandwidth. For example, the output 306 is used to conduct RF signals to an RF circuit. If the output of the antenna portions 302 and 304 has a certain impedance that includes only resistive component (reactive component value is equal 0), then if the RF circuit has the same impedance, a voltage standing wave ratio (VSWR) will have a value of 1.0 and the RF signal will be completely input into the RF circuit (i.e., no part of the RF signal will reflect back from the RF circuit). If, however, the output impedance of the antenna 300 and the input impedance of the RF circuit do not match, the VSWR increases to a multiple of 1.0, where the higher the ratio, the higher the VSWR and the lower the input of the RF signal into the RF circuit. These fundamental RF principles drive the configuration of the antenna 300. Because slight differences in the configuration of the antenna can have large effects in tuning the antenna 300 over the frequency ranges (i.e., AM, FM, and RKE frequency bands), many configurations of the basic structure of the antenna 300 may be used to provide RF output at a certain resistance (e.g., 50 Ohms) to match a resistance of an RF circuit (e.g., 50 Ohms). Of course, in practice, it is difficult to have a resistance of an antenna over a wide frequency range of exactly 50 Ohms as, typically, the resistance, even if well tuned, may be 50±10 Ohms, for example, that varies over the frequency range. In addition, the resistance has a mathematical imaginary component that also varies over the frequency range of the antenna. These fundamental RF principles can be seen on a Smith chart (see, for example, FIG. 13). As the impedance of the antenna 300 and RF circuit vary over the frequency bands, the matching of the impedances vary and, therefore, VSWR over the RF bands varies. As the VSWR varies, the gain of the system varies because the closer to unity of the VSWR, the higher the gain of the RF signals being received by the RF circuit. From these RF principles, other configurations of antennas to receive RF signals over AM, FM, and RKE frequency bands using the basic configuration of FIG. 3 are presented herein.

Figure 4:
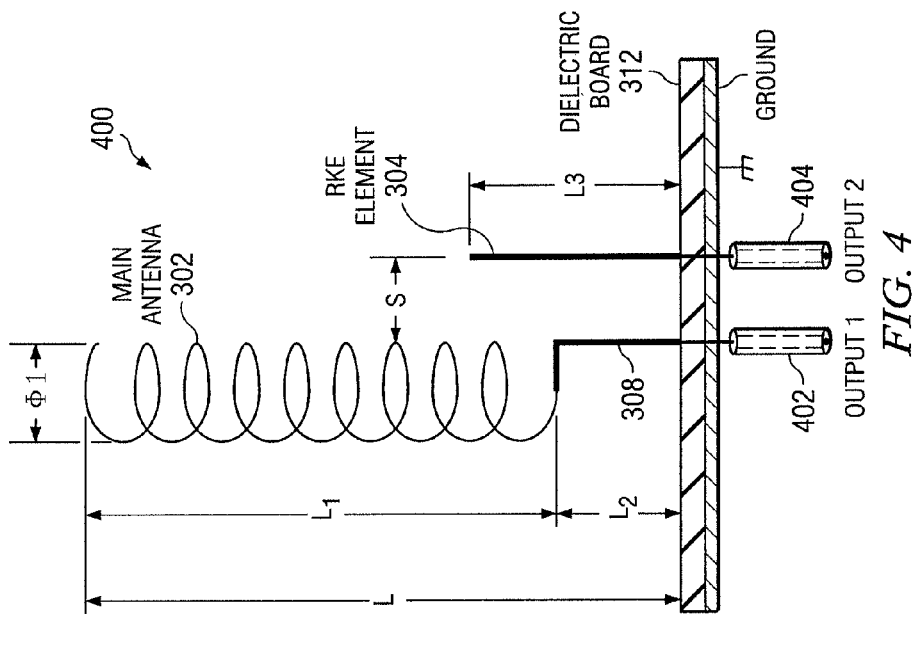
FIG. 4 is an illustration of another embodiment of an exemplary antenna having the same basic configuration as the antenna of FIG. 3, but having separate outputs for respective antennas.

FIG. 4 is an illustration of another embodiment of an exemplary antenna 400 having the same basic configuration as the antenna 300 of FIG. 3, but having separate outputs 402 and 404 for antennas 302 and 304, respectively. The stub antenna 304 in this configuration of the antenna 400 does not have an output portion that connects to the output portion 308 of the helical antenna 302. Although physically decoupled, the two antennas 302 and 304 are still coupled due to the separation distance S being close, thereby providing an RF coupling via an air interface. The RF coupling due to the antennas 302 and 304 being proximately positioned provides for tuning the two antennas 302 and 304 over the AM, FM, and RKE frequency bands, as described further herein.

Figure 5:
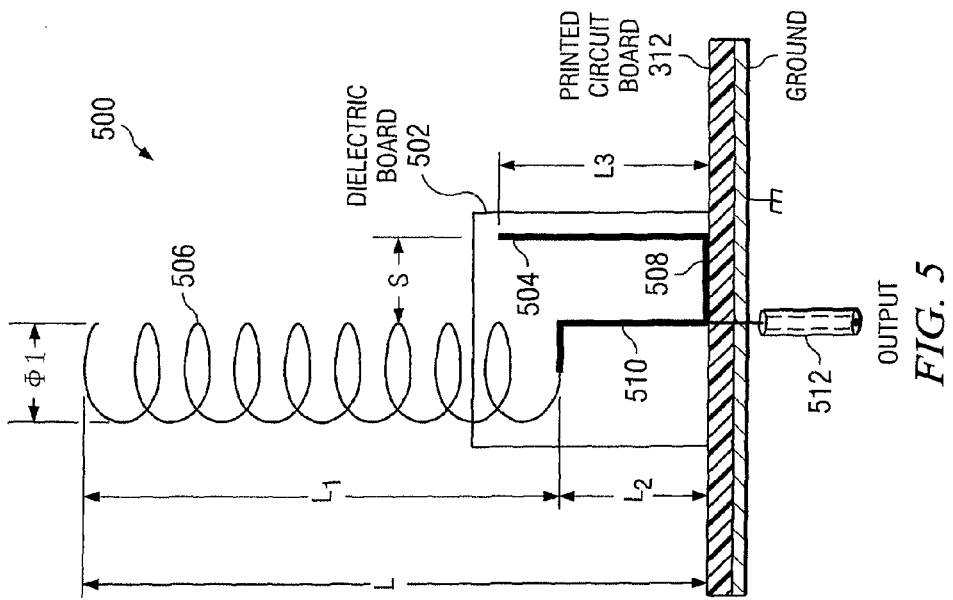
FIG. 5 is an illustration of another embodiment of an exemplary antenna having a similar configuration as the antenna of FIG. 3.

FIG. 5 is an illustration of another embodiment of an exemplary antenna 500 having a similar configuration as the antenna 300 of FIG. 3. However, antenna 500 uses a printed circuit board (PCB) 502 on which stub antenna 504 and output portion 508 of the stub antenna 504 are printed. Output portion 510 of the helical antenna 506 is also printed on the printed circuit board 502. The printed circuit board 502 may be composed of dielectric material, such as the same material as the printed circuit board 312, and be sized to fit the stub antenna 504 and output portion 510 of the helical antenna 506. The printed circuit board 502 may have an edge connector (not shown) that plugs into a socket (not shown) disposed in the printed circuit board 312. Using the printed circuit board 502 may improve or make easier connecting the output portions 508 and 510 of the stub and helical antenna 504 and 506, respectively. The antenna 500 connects to output conductor 512 for conducting radio and RKE frequency band signals to an RF circuit, such as an RF splitter (e.g., output splitter shown in FIG. 11A). An alternative embodiment of the antenna 500 may include separate outputs for the stub antenna 502 and helical antenna 506, such as the antenna 400 shown in FIG. 4. The connection to the output conductor 512 or two output conductors in the alternative configuration may utilize a solder connection, edge connector, or any other connection that provides for good RF continuity, thereby having minimal adverse VSWR over the radio and RKE frequency ranges.

Figure 6A:
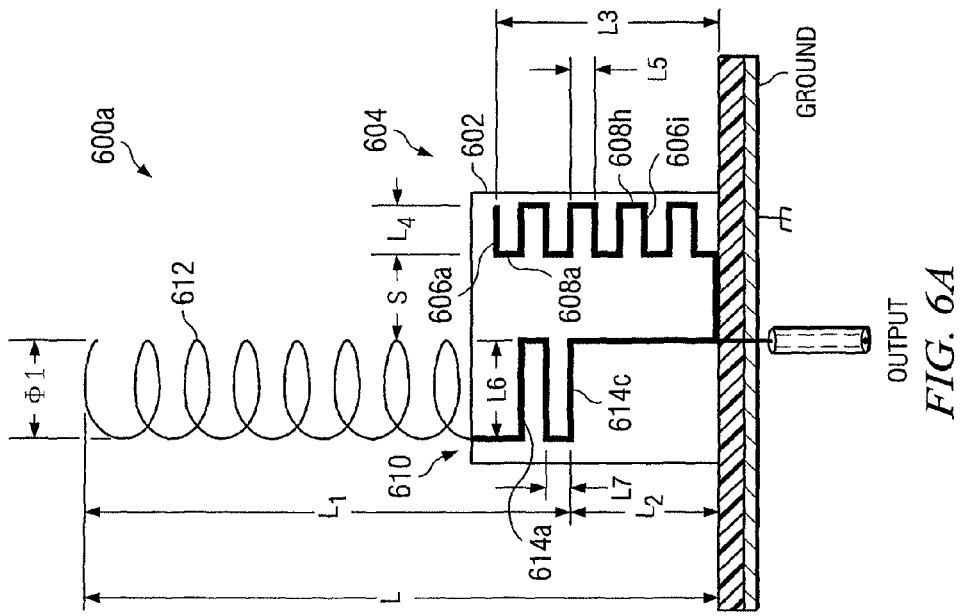
FIG. 6A is an illustration of another embodiment of an exemplary antenna configured to receive AM band, RF band, and RKE frequency band signals.

FIG. 6A is an illustration of another embodiment of an exemplary antenna 600a configured to receive AM band, RF band, and RKE frequency band signals. In this antenna 600a, a printed circuit board 602 is used for a meandering antenna 604, which is named after its configuration of a meandering pattern. The use of a meandering pattern allows for reduction in size of the antenna without significant reduction of antenna performance parameters, such as gain and output impedance. The meandering antenna 604 may include nine horizontal traces 606a-606i (collectively 606) and eight vertical traces 608a-608h (collectively 608), in one embodiment. The horizontal traces 606 may have a length L4 between approximately 2 mm and approximately 4 mm, and the vertical traces 608 may have a length L5 between approximately 1 mm and 2 mm. An output portion 610 of helical antenna 612 may have three horizontal traces 614a-614c (collectively 614) having a length L6 between approximately 0.5 cm and approximately 0.7 cm, and two vertical traces 616a-616b (collectively 616) having a length L7 approximately 20 mm and approximately 40 mm. Similar to the antenna of FIG. 3, the meandering antenna 604 and helical antenna 612 are separate antennas that operate as portions of the antenna 600a that operate to receive RF signals over different frequency ranges. As understood in the art, the performance of any communications system is dictated by the antenna and noise characteristics, so operation of the stub antenna 304 and 504 (FIGS. 3-4 and 5, respectively) and meandering antenna 604 (FIG. 6) generally dictates operation of the RF system.

Figure 6B:
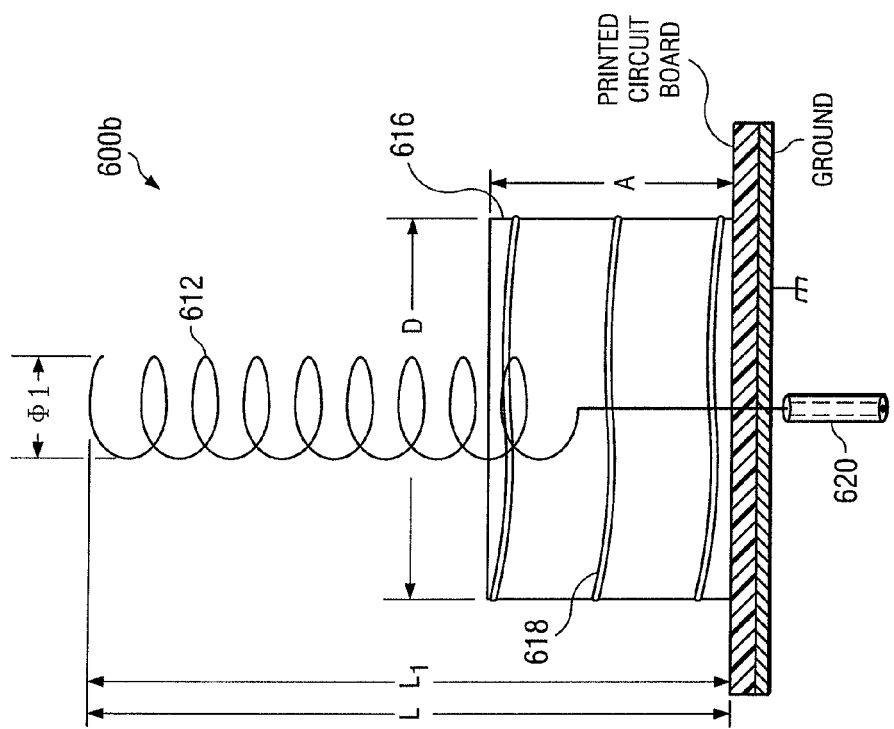
FIG. 6B is an illustration of another embodiment of an exemplary antenna configured to receive AM band, RF band, and RKE frequency band signals.

FIG. 6B is an illustration of another embodiment of an exemplary antenna 600b configured to receive AM band, RF band, and RKE frequency band signals. In this antenna 600b, a printed circuit board 616 is used for a helical antenna 618 disposed on the printed circuit board 616. The use of a helical pattern allows for reduction in size of the antenna without significant reduction of antenna performance parameters, such as gain and output impedance. The helical antenna 618 may include one or more traces. In one embodiment, the diameter D of the antenna is between approximately 1 cm and approximately 4 cm and the height A is between approximately 1.5 cm and approximately 7 cm. Similar to the antenna of FIG. 3, the helical antenna 618 and helical antenna 612 may be separate antennas that operate as portions of the antenna 600b that operate to receive RF signals over different frequency ranges. The two helical antennas 612 and 618 may have a common output 620. Alternatively, separate outputs (not shown) may be connected to respective antennas 612 and 618.

Figure 7:
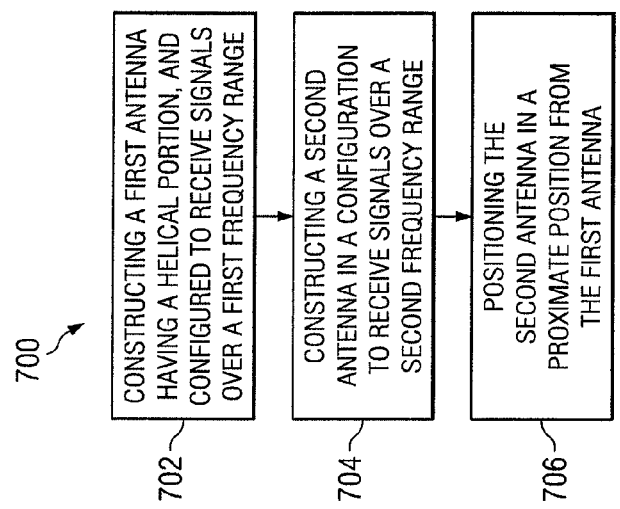
FIG. 7 is a flow diagram of an exemplary process for constructing a tri-band antenna in accordance with the principles of the present invention.

FIG. 7 is a flow diagram of an exemplary process 700 for constructing a tri-band antenna in accordance with the principles of the present invention. The process 700 starts at step 702, where a first antenna having a helical portion and configured to receive signals over a first frequency range is constructed. The first frequency range is an FM frequency band range. At step 704, a second antenna may be constructed in a configuration to receive signals over a second frequency range. The second frequency range may be an RKE frequency band. At step 706, the second antenna may be positioned in proximate distance or position from the first antenna. In one embodiment, the second antenna is a stub antenna and positioned within approximately 2 mm and approximately 4 mm from the first antenna. Construction of the first and second antennas may be in accordance with FIGS. 3-6 or as otherwise conforming to the principles of the present invention.

Figure 8:
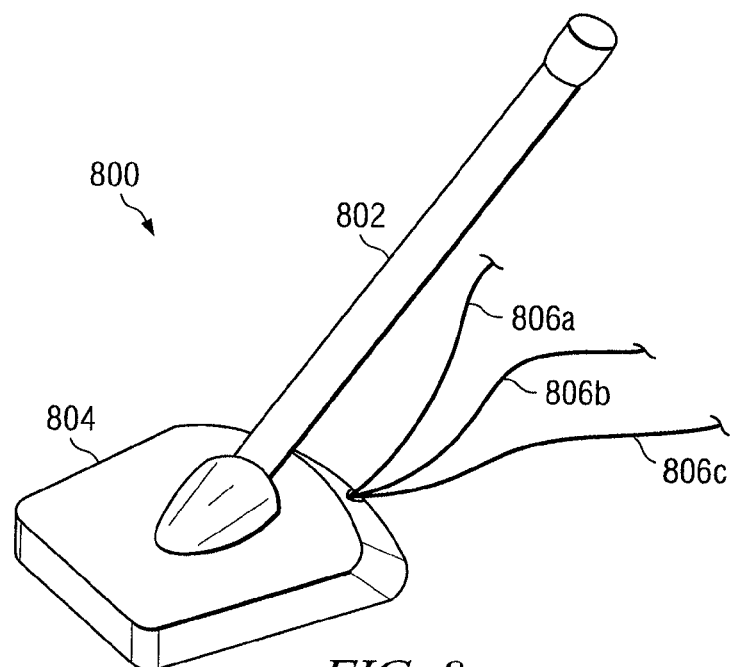
FIG. 8 is an illustration of an exemplary antenna system configured to operate over AM, FM, and RKE frequency bands.

FIG. 8 is an illustration of an exemplary antenna system 800 configured to operate over AM, FM, and RKE frequency bands. The antenna system 800 may include an antenna portion 802 coupled to a base portion 804. The antenna portion 802 may include a housing, which may be plastic, that covers a helical antenna to protect the helical antenna from being damaged by weather, debris, carwashes, or other man-made or natural conditions. Within the base portion 804, a splitter may be housed because, as a general rule, amplifiers, if used in a splitter or otherwise, are placed in close proximity to the antenna. The splitter may operate to separate the FM, AM, and RKE frequency band signals received by the antenna. In one embodiment, an electrical cable 806a and two RF cables 806b-806c (collectively 806) may extend from the base portion 804 to a radio and RKE control module located within the vehicle. It should be understood that other antenna system configurations may be utilized in accordance with the principles of the present invention. For example, rather than housing the splitter in the base portion 804, the splitter may be located elsewhere in the vehicle (e.g., a new line with one of the RF cables 806), but still within close proximity of the antenna.

Figure 9A:
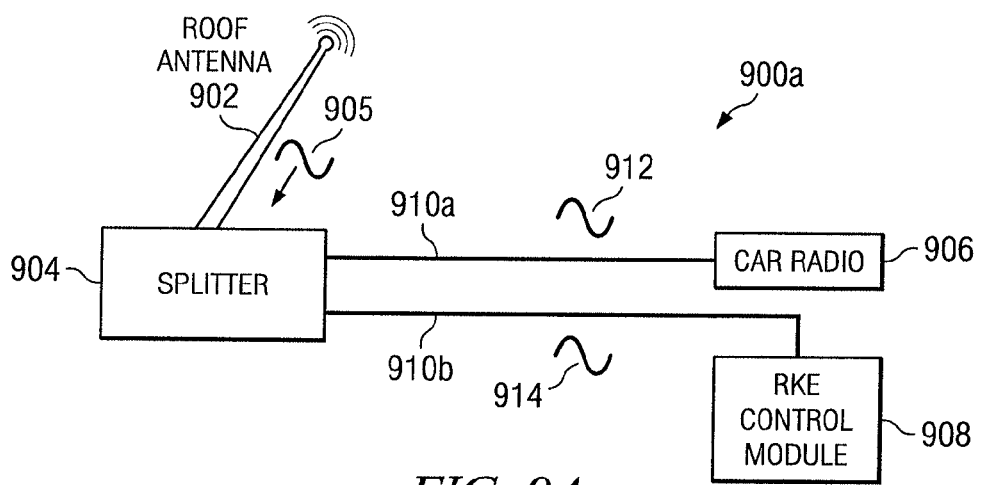
FIG. 9A is an illustration of a system for receiving radio signals and RKE signals at a vehicle.

FIG. 9A is an illustration of a system 900a for receiving radio signals and RKE signals at a vehicle. The system 900a may include a roof antenna 902 that is in communication with a splitter 904. The splitter 904 may be configured to receive radio and RKE signals 905 from the roof antenna 902 and separate the signals for communications of respective signals to a car radio 906 and RKE control module 908. In this embodiment, two RF cables 910a and 910b are connected between the splitter 904 and car radio 906 and RKE control module 908, respectively, for enabling radio signals 912 and REF signals 914 to be communicated to the car radio 906 and RKE control module 908, respectively. It should be understood that other cable configurations between the splitter 904, car radio 906, and RKE control module 908 may be utilized in accordance with the principles of the present invention. For example, the splitter 904 may be located closer to the car radio 906 and RKE control module 908 so that a single cable extends from the roof antenna 902 to the splitter 904 and shorter RF cables may connect between the splitter 904 and car radio 906 and RKE control module 908. Still yet, the splitter 904 may be connected to or incorporated with the RKE control module 908 and a single RF cable may extend between the RKE control module 908 and car radio 906.

Figure 9B:
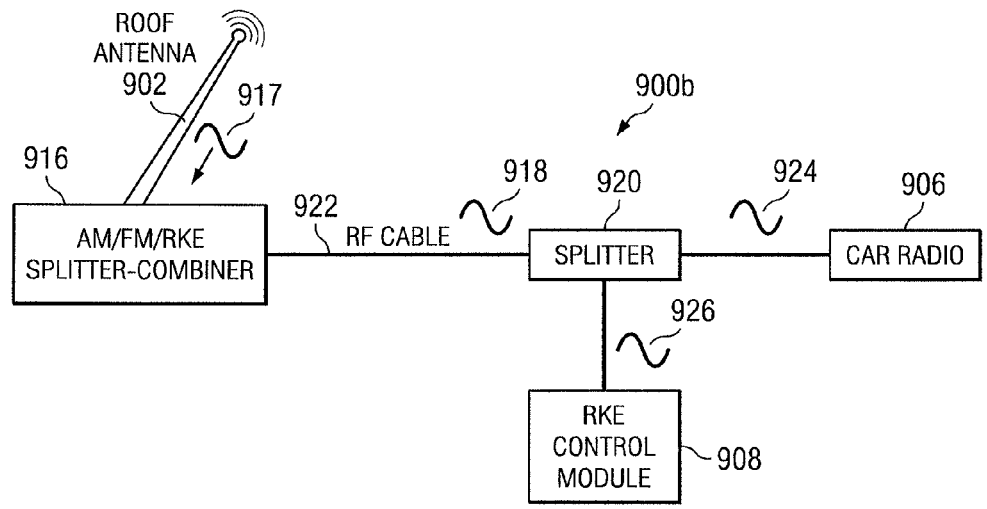
FIG. 9B is an illustration of an exemplary system for receiving radio and RKE band signals.

FIG. 9B is an illustration of an exemplary system 900b for receiving radio and RKE band signals. The system 900b may include a roof antenna 902 connected to a splitter-combiner 916. The splitter-combiner 916 may be configured to receive radio band and RKE band signals 917 from the roof antenna 902 in order to separate, filter, and communicate the filtered signals 918 to splitter 920 via RF cable 922. The splitter 920 may be configured to receive the filtered signals 918 and separate radio signals 924 and RKE signals 926 for communication to the car radio 906 and RKE control module 908, respectively. This configuration uses a single RF cable 922 and may reduce part count, weight and complexity for car manufacturers.

Figure 10:
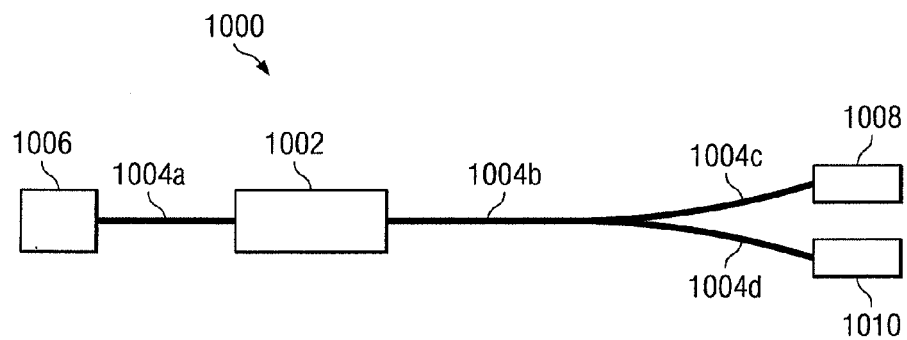
FIG. 10 is an illustration of an exemplary RF cable unit that includes a splitter configured in-line with an RF cable.

FIG. 10 is an illustration of an exemplary RF cable unit 1000 that includes a splitter 1002 configured in-line with an RF cable 1004a-1004d (collectively 1004). The RF cable 1004 may be connected to a connector 1006 configured to connect to an antenna configured to receive radio and RKE signals and connectors 1008 and 1010 configured to connect to a car radio and RKE control module. In one embodiment, the connectors 1006, 1008, and 1008 are standard off-the-shelf connectors. By configuring the splitter 1002 to be in-line with the RF cable 1004, a roof antenna or other device may be smaller as the splitter may be positioned in an otherwise unused area of a vehicle. Insertion loss for an RF cable including an in-line splitter, such as the one shown in FIG. 10, may be in the range of 0.8 dB and 1.0 dB over the FM frequency band.

Two types of antennas may generally be used with the splitter designs described hereinbelow, including a roof antenna, such as those described above, and whip antenna. Whip antennas, as understood in the art, have enough length to provide sufficient gain so amplifiers may be avoided for AM/FM channels in the splitter. However, roof antennas do not generally provide sufficient gain, so amplifiers are provided in the radio bands.

Figure 11A:
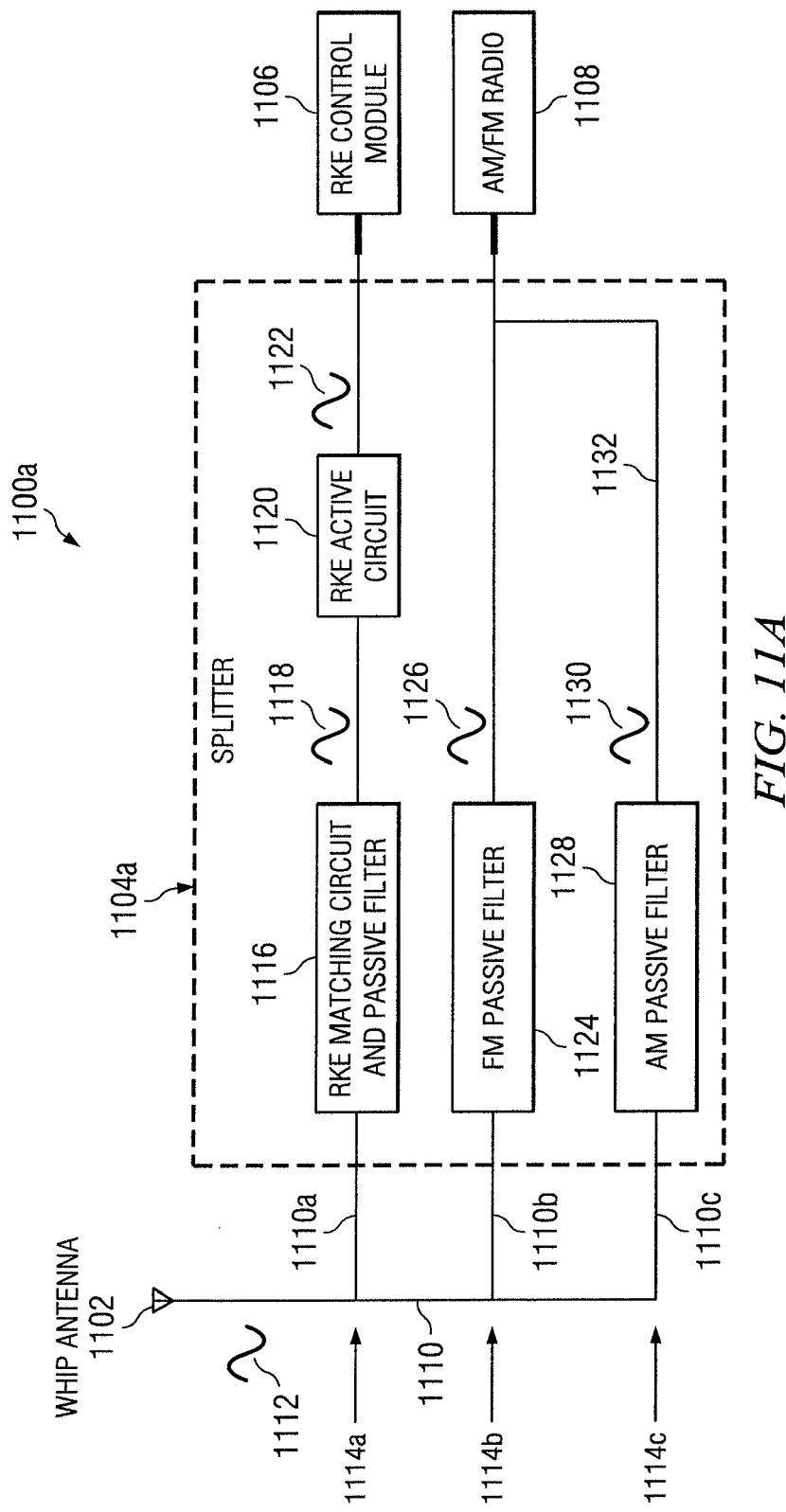
FIG. 11A is a block diagram of an exemplary RF system that includes a roof antenna, splitter, RKE control module, and AM/FM radio.

FIG. 11A is a block diagram of an exemplary RF system 1100a that includes a roof antenna 1102, splitter 1104a, RKE control module 1106, and AM/FM radio 1108. The whip antenna 1102 may be configured as an antenna to receive radio signals (e.g., AM and FM frequency band signals) and RKE signals. The whip antenna 1102 may be in communication with the splitter 1104a via RF cable 1110 that includes three RF cable branches 1110a, 1110b, and 1110c. RF signals 1112 that are received from the whip antenna 1102 are input into circuit paths respectively connected to each of the RF cable branches 1110a-1110c. A first circuit path 1114a may include an RKE matching circuit and passive filter 1116 that is matched to an impedance of the whip antenna 1102 that receives RKE signals as well as radio signals (i.e., RF signals 1112). The RKE matching circuit and passive filter 1116 is further configured to filter non-RKE signals, such as radio signals received by the whip antenna 1102, and output filtered RKE signals 1118. The filtered RKE signals 1118 may be input into an RKE active circuit 1120 which may amplify the filtered RKE signal 1118 to output an amplified filtered RKE signal 1122. The amplified filtered RKE signal 1122 may be input into the RKE control module 1106 for causing the RKE control module 1106 to control a lock of a vehicle door, for example.

Transmission path 1114b may include a FM passive filter 1124 that is configured to filter FM frequency band signals from the RF signals 1112 to generate an FM frequency band signal 1126 for input into the AM/FM radio 1108. Transmission path 1114c may include an AM passive filter 1128 that is configured to filter the RF signals 1112 to generate a filtered AM frequency band signal 1130 that may be communicated to the AM/FM radio 1108. The AM passive filter 1128 may be configured to not utilize an amplifier or other active circuit and tune passive elements in the AM passive filter 1128 based on impedance of cable 1132 that is input into the AM/FM radio 1108. In part, the length of the RF cable 1132 between the AM passive filter 1128 and radio 1108 may determine impedance of the cable 1132. The splitter 1104a may be located close to the whip antenna 1102 or radio 1108 as there is sufficient gain in RF signals received by the whip antenna 1102 in either configuration to operate properly.

While FIG. 11A shows three RF branches 1114a-1114c, where the RKE branch 1114a utilizes an active circuit 1120 and neither of the other branches 1114b and 1114c use an active circuit, other embodiments of the splitter 1104a may be utilized in accordance with the principles of the present invention and include active circuitry as further described hereinbelow.

Figure 11B:
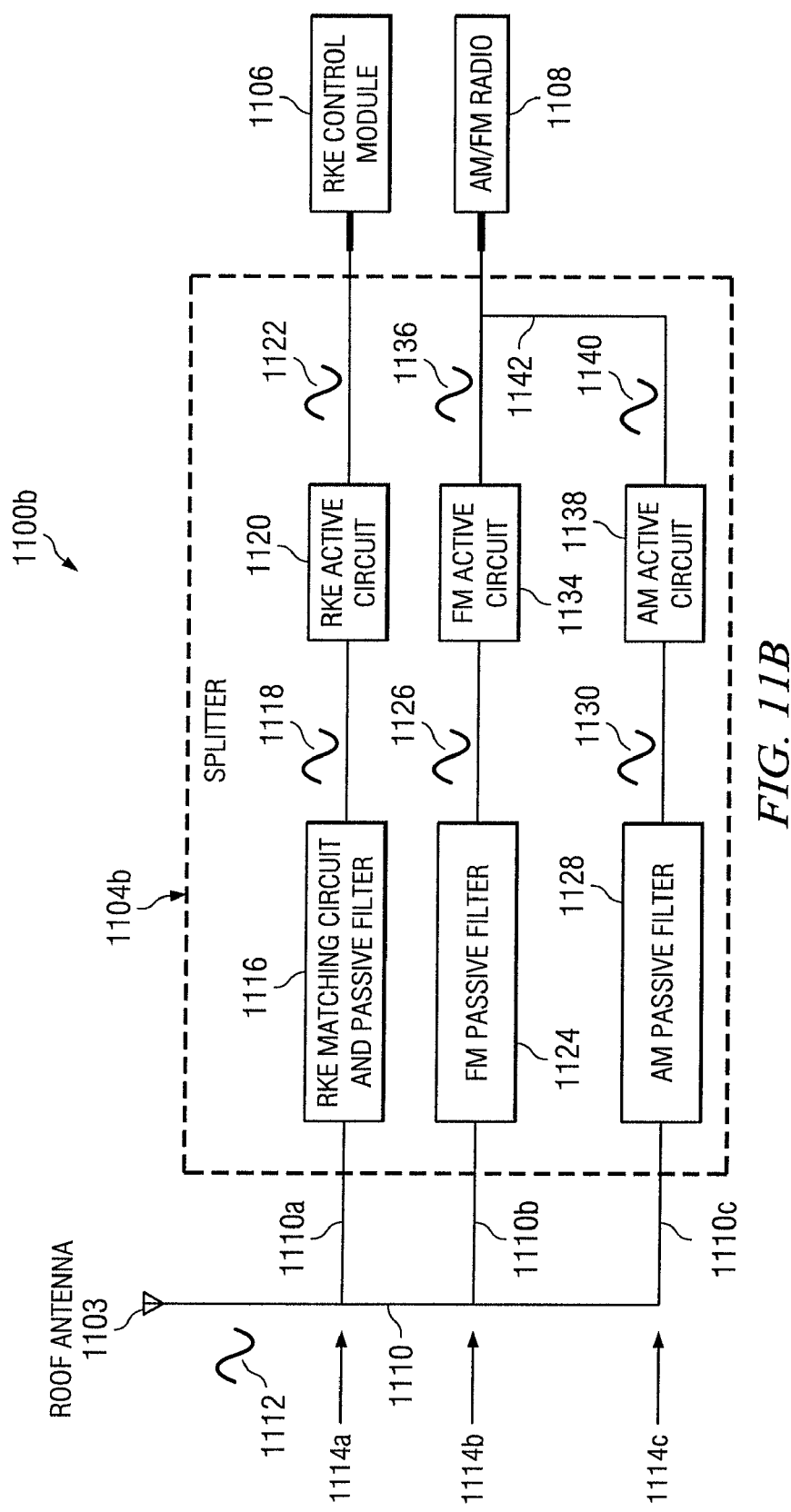
FIG. 11B is an alternative embodiment of the antenna system of FIG. 11A.

FIG. 11B is an alternative embodiment of the antenna system of FIG. 11A. As shown, a different splitter 1104b is used to receive and process RF signals 1112 from a roof antenna 1103, which has a lower gain than a whip antenna, as described above. Because the roof antenna 1103 has lower gain than a whip antenna, the splitter 1104b may include the same RKE transmission path 1114a, but use active circuits to amplify the filtered signals 1126 and 1130 prior to be communicated to the radio 1108. As shown, an FM active circuit 1134 is located in the transmission path 1114b after the FM passive filter 1124. The FM active circuit 1134 may be configured to amplify the filtered FM signal 1126 to generate an amplified filtered FM signal 1136 for input into the radio 1108. On the AM transmission path 1114c, an AM active circuit 1138 may be utilized to amplify the filtered AM signal 1130 to generate an amplified filtered AM signal 1140 for input into the radio 1108. In the case of using the AM active circuit 1138, tuning the AM passive filter 1128 to match the impedance of cable 1142 connected to the radio 1108 is less important since the AM active circuit 1138 may overcome attenuation of the filtered AM signal 1130 due to impedance in the cable 1142.

Figure 11C:
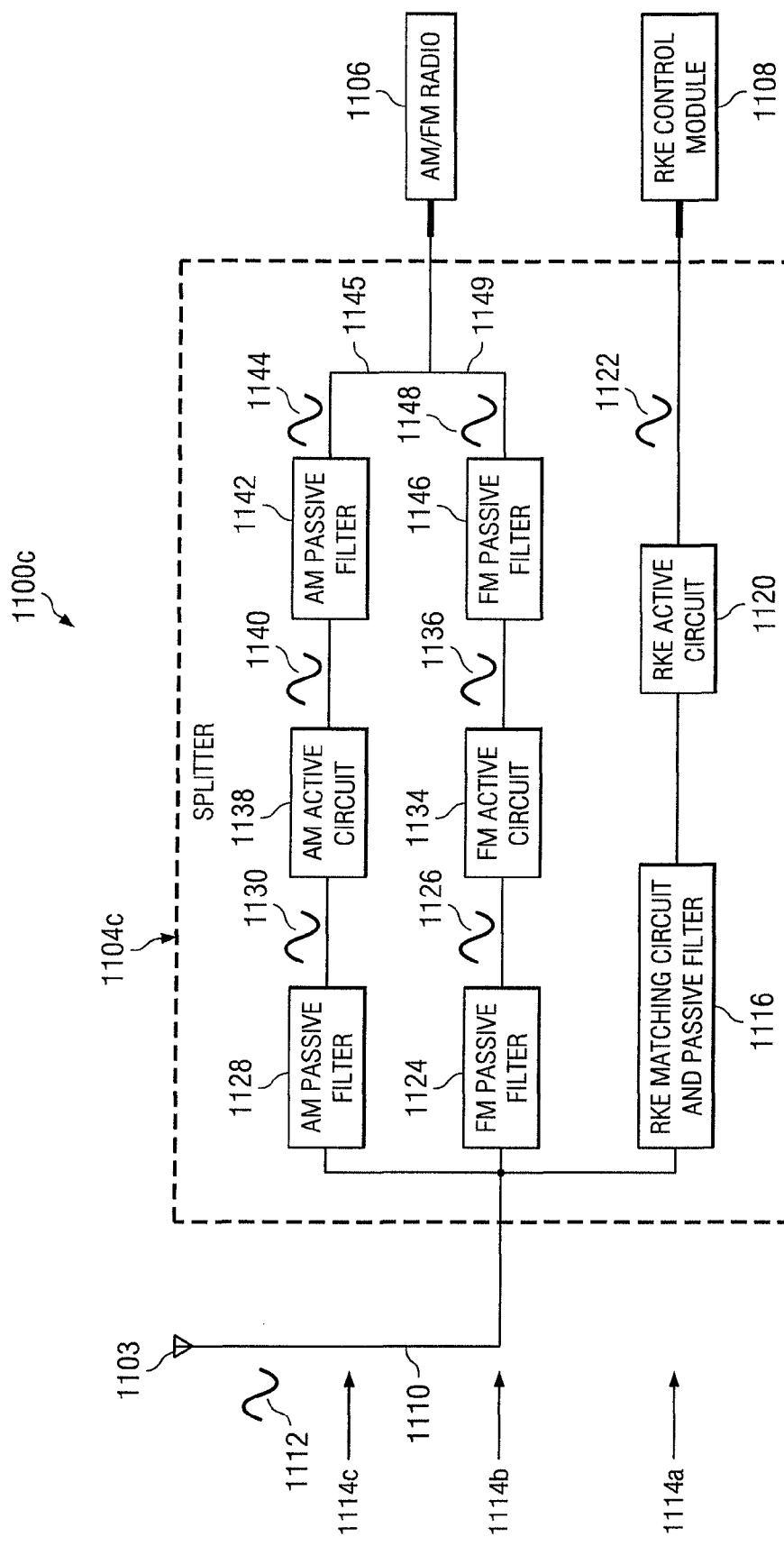
FIG. 11C is a block diagram of another exemplary embodiment of an RF system for receiving radio and RKE signals.

FIG. 11C is a block diagram of another exemplary embodiment of an RF system 1100c for receiving radio and RKE signals. In this embodiment, a splitter 1104c, which is in communication with the roof antenna 1103, is configured to combine outputs of the FM and AM communications paths 1414b and 1414c, respectively, for input to the AM/FM radio 1108. To accomplish combining the outputs of the paths 1414b and 1414c, an AM passive filter 1142 is included to filter the amplified filtered AM signal 1140 to generate an output AM signal 1144. The AM passive filter 1142 may be configured to accommodate or otherwise impedance mach an impedance of cable 1145. FM passive filter 1146 may also be included to filter the amplified filtered FM signal 1136 to generate a filtered FM signal 1148, where the FM passive filter 1146 is tuned to match impedance of the cable 1149. In one embodiment, the splitter is an in-line splitter that is inserted in cable 1110. Alternatively, the splitter 1104c is located at the antenna 1102. Still yet, the splitter 1104c may be located at the RKE control module 1108 or AM/FM radio 1108. In summary, the splitter 1104c allows for splitting the radio and RKE signals, but uses a single cable to communicate the filtered radio signals to the radio 1108.

Figure 11D:
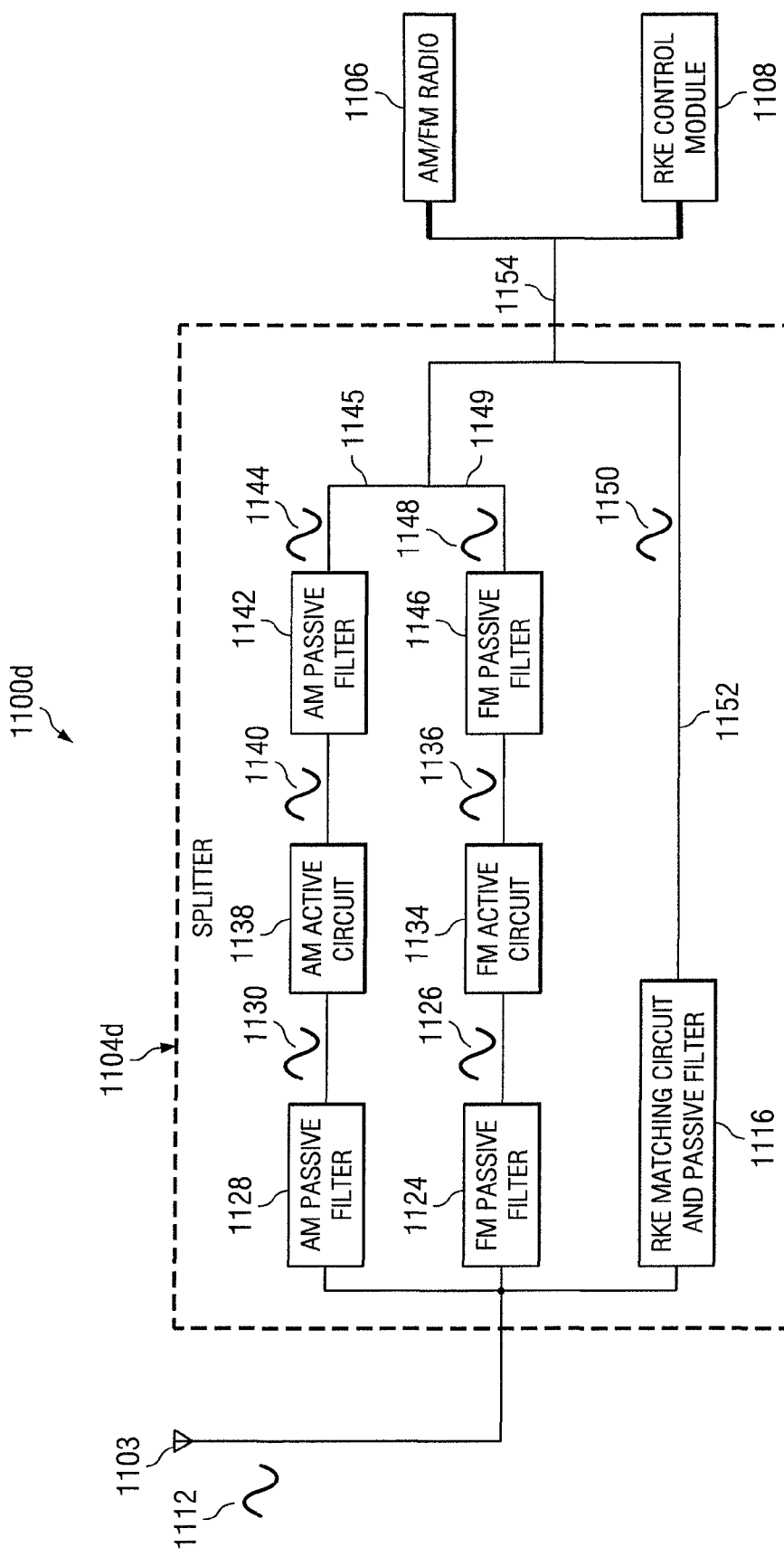
FIG. 11D is a block diagram of another exemplary RF system that includes another configuration of a splitter.

FIG. 11D is a block diagram of another exemplary RF system 1100d that includes another configuration of a splitter 1104d that operates to split the RF signals 1112 received from the roof antenna 1103, process the signals at different frequency bands (i.e., AM, FM, and RKE frequency bands), and combine the processed signals, including signals 1144, 1148, and 1150 for communication to the radio 1108 and RKE control module 1106. This configuration enables the splitter 1104d to be connected to a single RF cable 1154 for connection to the radio 1108 and RKE control module 1106, which saves space, cost, and complexity. In one embodiment, splitter 1104a of FIG. 11A is used to separate the signals at the RKE control module (see FIG. 9B).

In contrast to the FM frequency band, no matching of antenna impedance with the nominal impedance of the cable is attempted in the AM frequency band range since a broadband solution cannot be found. Capacitive impedance value of a splitter-whip antenna is approximately 15.6 KOhms (KΩ) and 10 pF. Modern receivers in the AM frequency range use a capacitive non-resistive input stage with an input capacitor that is typically on the order of 15 pF.

Figure 12A:
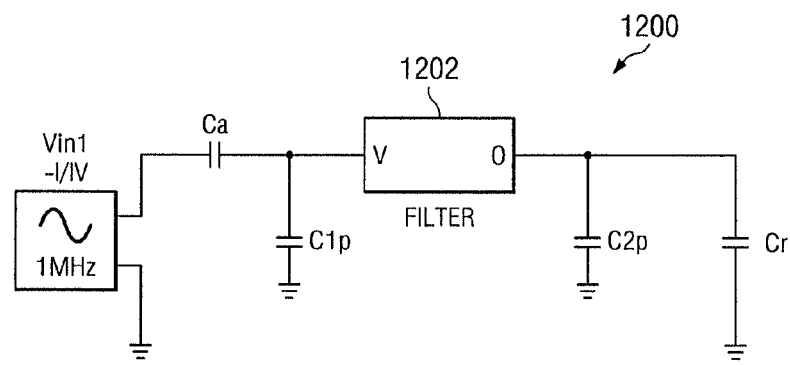
FIG. 12A is a schematic of an exemplary equivalent circuit AM signal analysis.

FIG. 12A is a schematic of an exemplary equivalent circuit 1200 AM signal analysis. An antenna is modeled by capacitor $C_a$, which has an impedance of 15.6 KΩ and open source voltage V. An input RF signal is modeled using a 1 MHz oscillation signal. A coaxial cable is modeled by a capacitive load $C_{1p}$, the cable is short in comparison to RF signal wavelength. The coaxial cable being modeled by the capacitive load $C_{1p}$, is representative of a portion of the RF cable between the antenna connector and splitter input. Another portion of the RF cable is modeled by capacitive load $C_{2p}$, that is representative of a portion of the RF cable between an output of the splitter and receiver connector of a radio. An input stage of the receiver is modeled by input capacitor $C_r$. A filter 1202 may be included in the equivalent circuit model 1200 and an RF signal analysis may be performed using the equivalent circuit including the filter 1202. It should be understood that similar models may be used for analyzing the RF and RKE signal paths, as shown in FIGS. 11A-11D, for example.

Figure 12B:
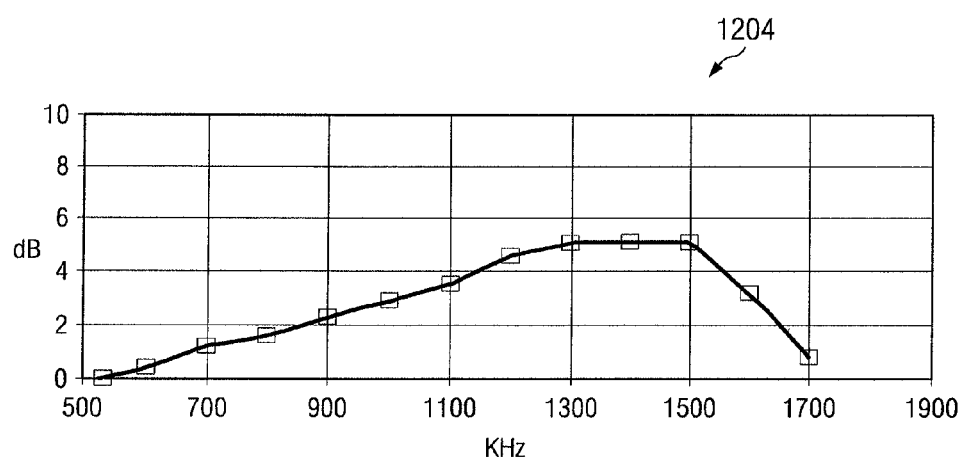
FIG. 12B is a graph of an exemplary gain plot of an AM radio signal path via a passive splitter inserted between an antenna and vehicle radio.

FIG. 12B is a graph of an exemplary gain plot 1204 of an AM radio signal path via a passive splitter inserted between an antenna and vehicle radio. As shown, gain along the AM signal path increases from 0 dB near 500 KHz to approximately 5 dB between 1.3 KHz and 1.5 KHz and drops to about 1 dB at 1700 KHz. It should be understood that the gain along the AM frequency band may be shaped using different tuning at the passive filter. Other factors, such as impedance of RF cables (i) between the antenna and passive filter and (ii) between the passive filter and radio also have an impact in the gain within the AM band of an RF system, as understood in the art. By way of comparison, the AM signal without the passive filter within the splitter has a power level of approximately 0 dB across the AM band.

Figure 13:
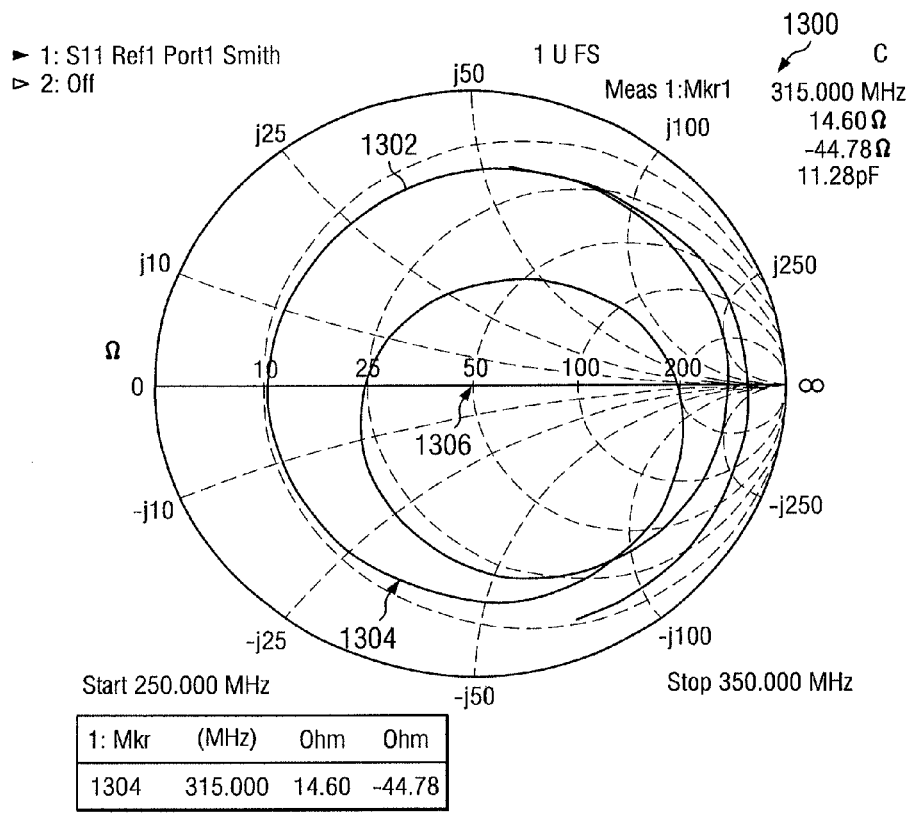
FIG. 13 is a Smith chart used for displaying an exemplary impedance plot that shows impedance of a whip antenna over an RKE frequency band.

FIG. 13 is a Smith chart 1300 used for displaying an exemplary impedance plot 1302 that shows impedance of a whip antenna over an RKE frequency band. In designing an RKE signal path, a network analyzer that is capable of generating the Smith chart 1300 may be used to analyze impedances over an RKE frequency range. As shown on the Smith chart 1300, the input impedance plot 1302 shows input impedance of a whip antenna in connection with a regular production cable having an impedance of 50 Ohms. Because the antenna and radio cable are highly mismatched in impedance, a VSWR value is much more than one results. A marker 1304 shows an impedance or resistance of 14.6 Ohms at 315 MHz. As understood in the art, if the input impedance of the whip antenna were to match the regular production cable impedance of 50 Ohms at 315 MHz, the input impedance plot 1302 would cross at or near 50 Ohms at marker 1306 with little imaginary component. For good reception of the RKE signal by an RKE control module, the antenna input impedance should be 50 Ohms or close thereto. In addition, antenna output impedance should match input amplifier impedance. By matching the antenna input and output impedance with a filter and/or amplifier input impedance, maximum power of RKE signals received from the antenna may be communicated to the RKE control module. In other words, matching impedances along the RF paths results in minimum attenuation due to low VSWR (i.e., a VSWR close to 1:1 or 1.0).

Figure 14:
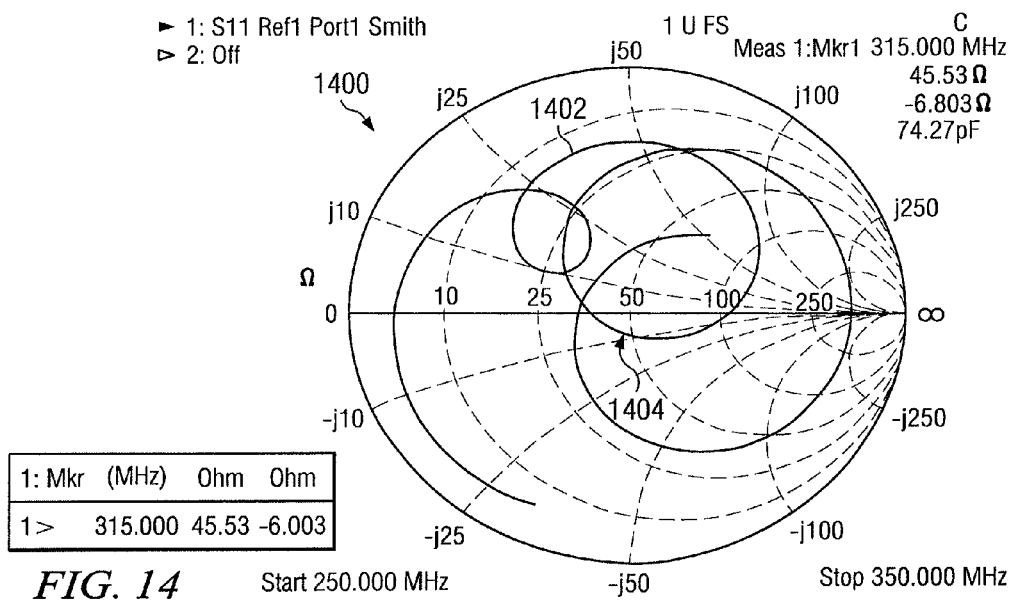
FIG. 14 is a Smith chart showing an exemplary impedance plot at an output of a passive RKE matching circuit branch of a splitter using a whip antenna.

FIG. 14 is a Smith chart 1400 showing an exemplary impedance plot 1402 at an output of a passive RKE matching circuit branch of a splitter using a whip antenna. At a frequency of 315 MHz, shown at marker 1404, impedance is close to 50 Ohms. Because the impedance is close to 50 Ohms, the VSWR is 1.2, which is a significant improvement from the VSWR shown in FIG. 13 at a frequency of 315 MHz (i.e., a center frequency at which the RKE signals are being received in one embodiment).

Figure 15:
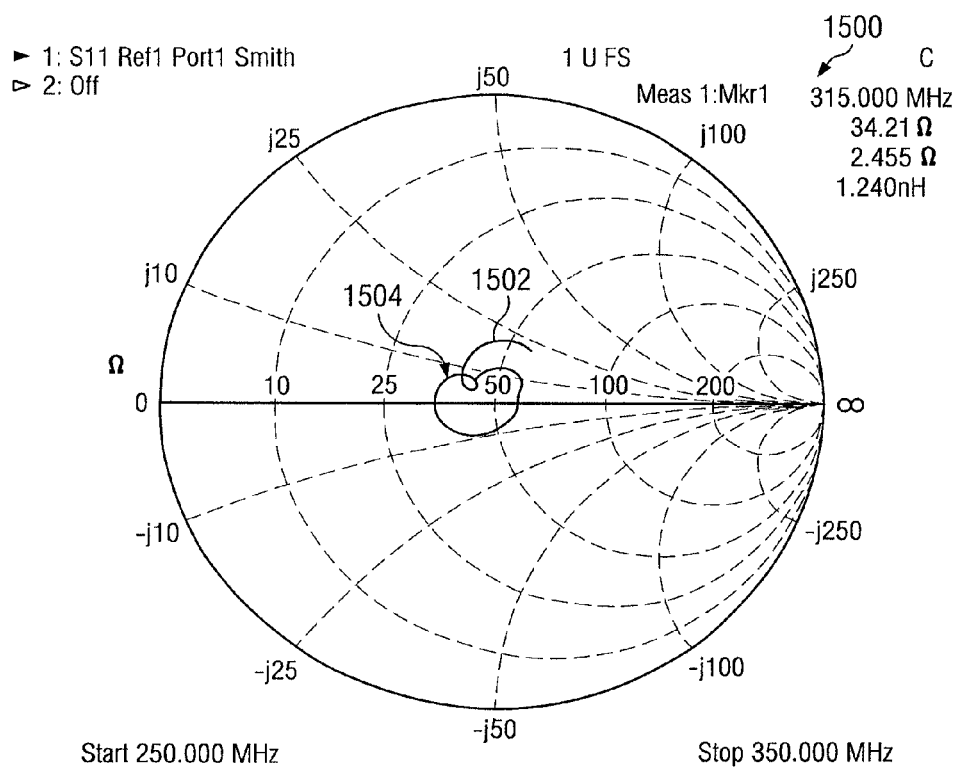
FIG. 15 is a Smith chart showing an exemplary impedance plot of an output impedance of an amplifier operating over an RKE frequency band.

FIG. 15 is a Smith chart 1500 showing an exemplary impedance plot 1502 of an output impedance of an amplifier operating over an RKE frequency band. A splitter may include a band pass filter prior to the amplifier for blocking AM and FM frequency band signals and passing the RKE frequency band. Amplification using the amplifier used for creating the impedance plot 1502 has a gain of 15 dB when an input source has an impedance of 50 Ohms and the output load has 50 Ohms impedance. Marker 1504 located at frequency 315 MHz is shown to be about 37 Ohms and have about j5 impedance.

Figure 16:
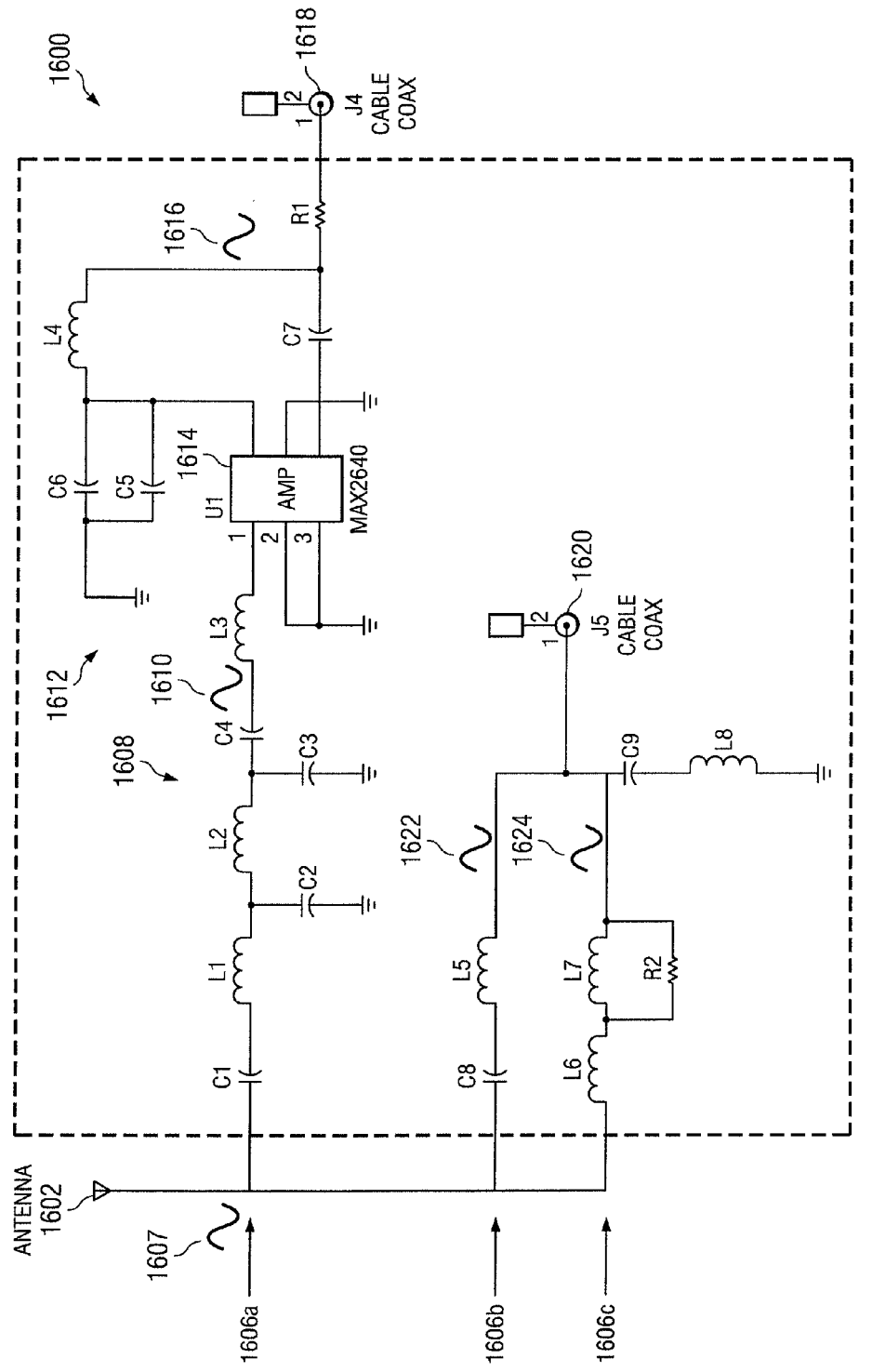
FIG. 16 is a schematic of an exemplary splitter-antenna for a whip antenna.

FIG. 16 is a schematic of an exemplary splitter-antenna 1600 for a whip antenna. The splitter-antenna 1600 includes whip antenna 1602 and splitter 1604 that includes three transmission paths 1606a-1606c. The first transmission path 1606a is an RKE transmission path for filtering and amplifying an RKE frequency band signals received by the whip antenna 1602. Transmission path 1606b is used to filter FM frequency band signals, and transmission path 1606c is used to filter AM frequency band signals received from whip antenna 1602. When signals 1607 are received by whip antenna 1602, the signals are communicated along each of the respective transmission paths 1606a-1606c. Transmission path 1606a includes a passive band pass filter 1608 that generates a filtered RKE signal 1610 that is communicated to an active circuit 1612. The active circuit 1612 includes an amplifier 1614 to amplify the filtered RKE signal 1610 to generate an amplified filtered RKE signal 1616. The amplified filtered RKE signal 1616 is output onto a coaxial cable 1618 to be communicated to an RKE control module (not shown). A coaxial cable 1620 is used to communicate filtered FM signals 1622 and filtered AM signals 1624 to a radio (not shown).

Figure 17:
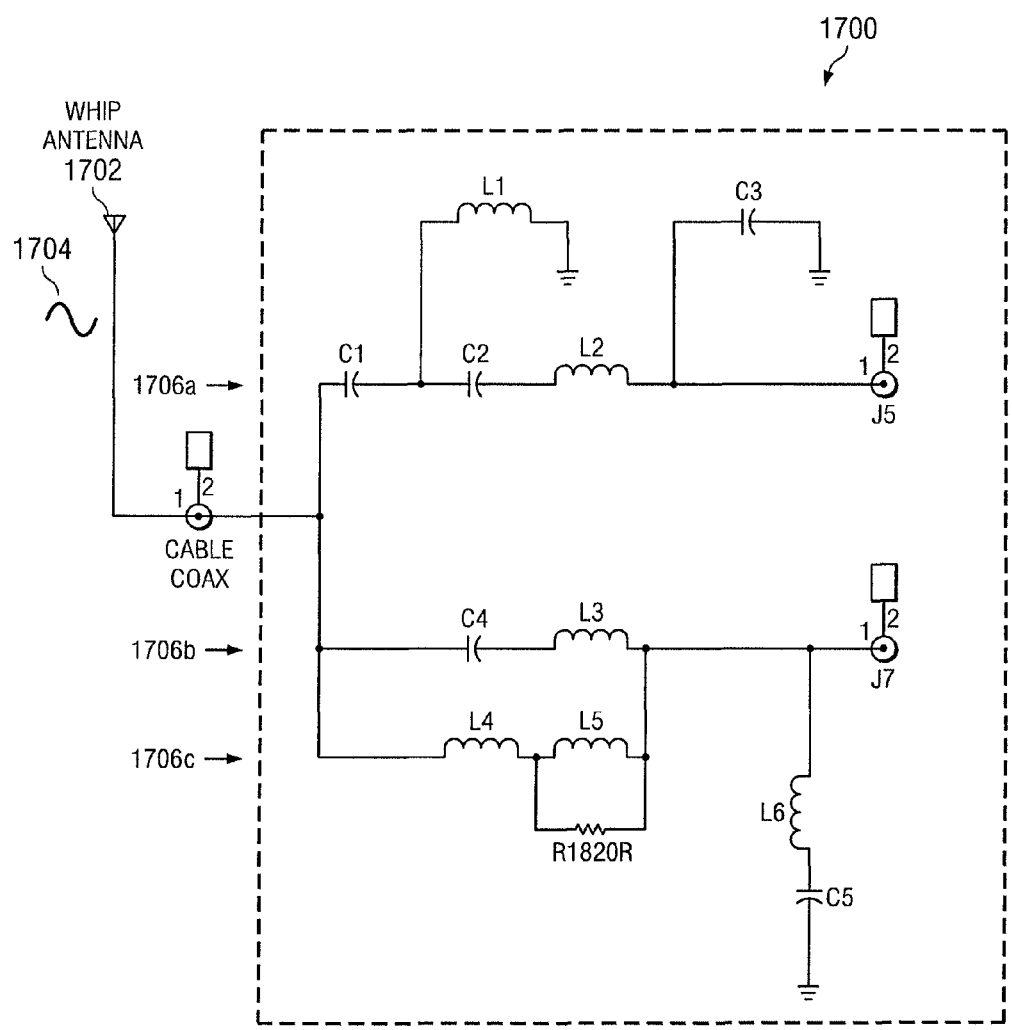
FIG. 17 is a schematic of an alternative splitter-antenna configured with a whip antenna to receive radio and RKE signals.

FIG. 17 is a schematic of an alternative splitter-antenna 1700 configured with a whip antenna 1702 to receive radio and RKE signals 1704. A splitter 1706 includes three passive branches, including transmission paths 1706a, 1706b, and 1706c. The transmission path 1706a is configured as a band pass filter to filter RKE frequency bank signals, transmission path 1706b is a transmission path configured to filter AM frequency band signals, and transmission path 1706c is a transmission path configured to filter FM frequency band signals. Each of the transmission paths may be tuned to match output impedance of the antenna 1702 and input impedance of the next RF circuit in the RF path.

Figure 18A:
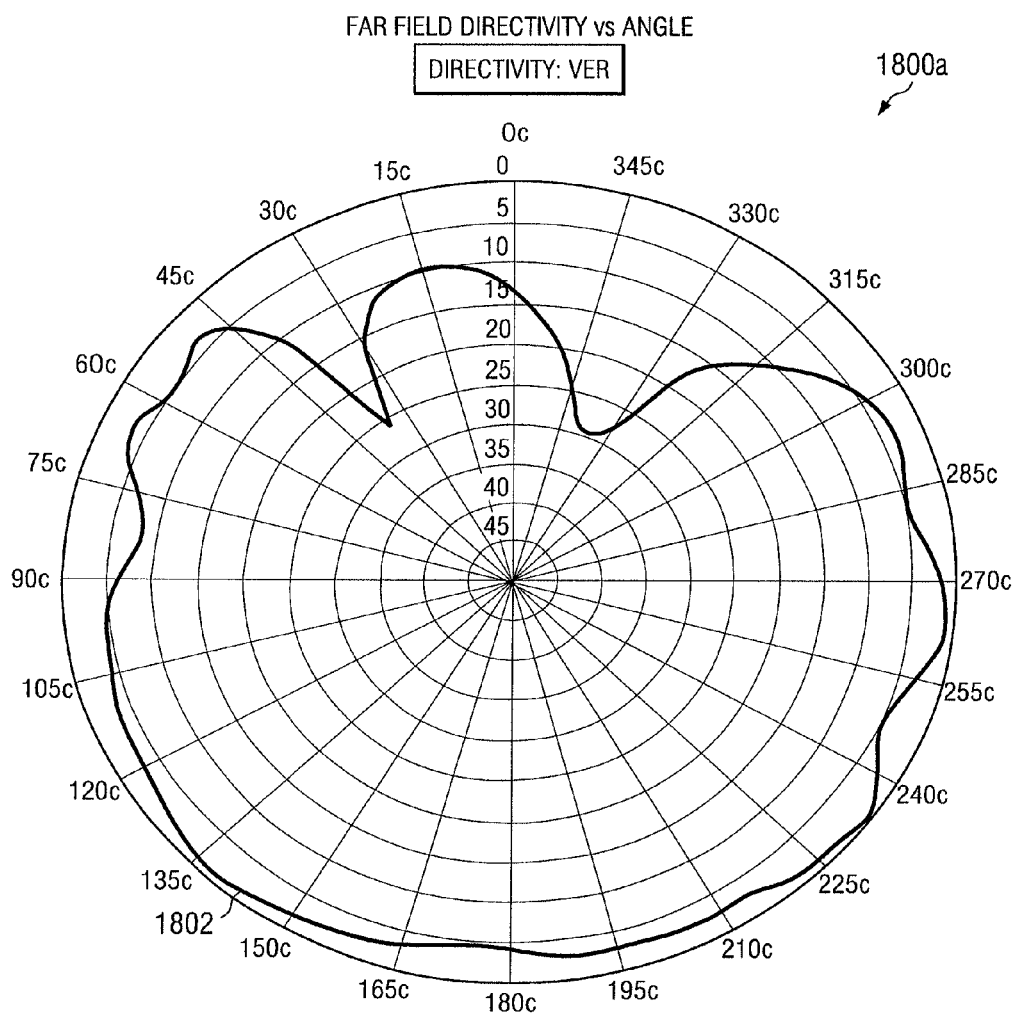
FIGS. 18A and 18B are polar plots showing simulated (FIG. 18A) and measured (FIG. 18B) results for a whip antenna directivity for the vertical polarization.
Figure 18B:
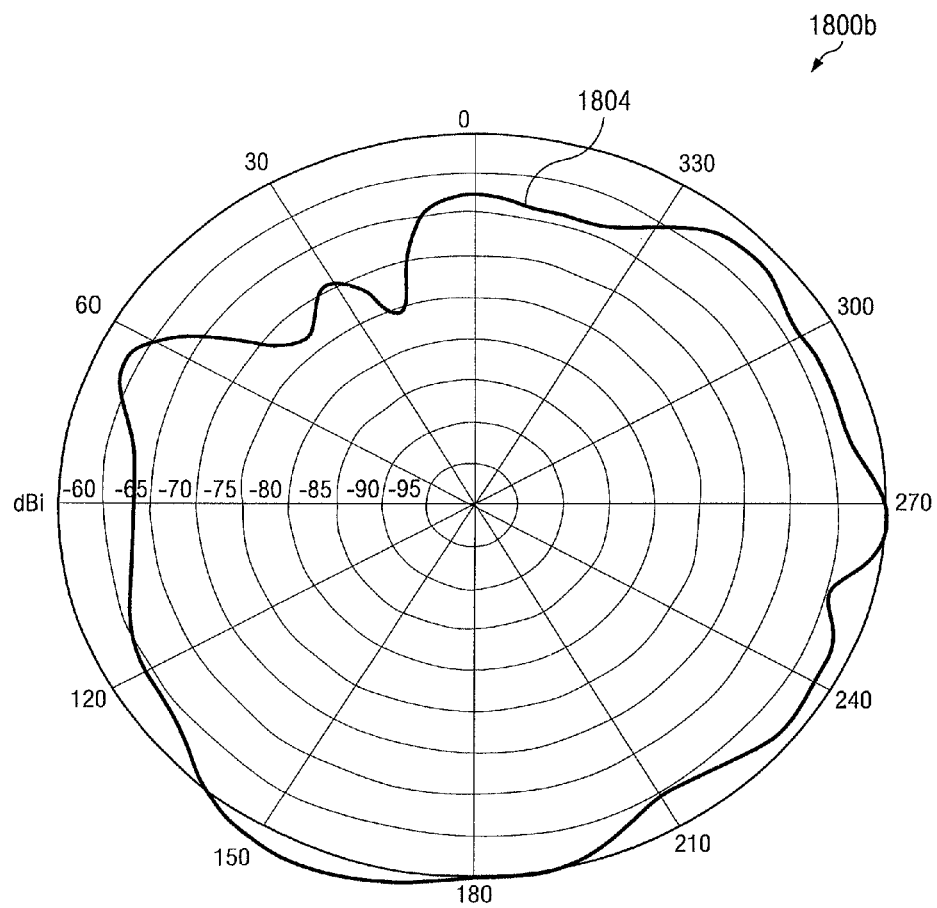

FIGS. 18A and 18B are polar plots showing simulated (FIG. 18A) and measured (FIG. 18B) results for a whip antenna directivity for the vertical polarization. Plot 1800a shows a far field directivity plot 1802 versus angle resulting from a simulation and plot 1800b shows a directivity plot 1804 resulting from measured signals of the whip antenna. In generating these plots 1800a and 1800b, front of a vehicle was oriented in the zero angle direction.

Figure 19A:
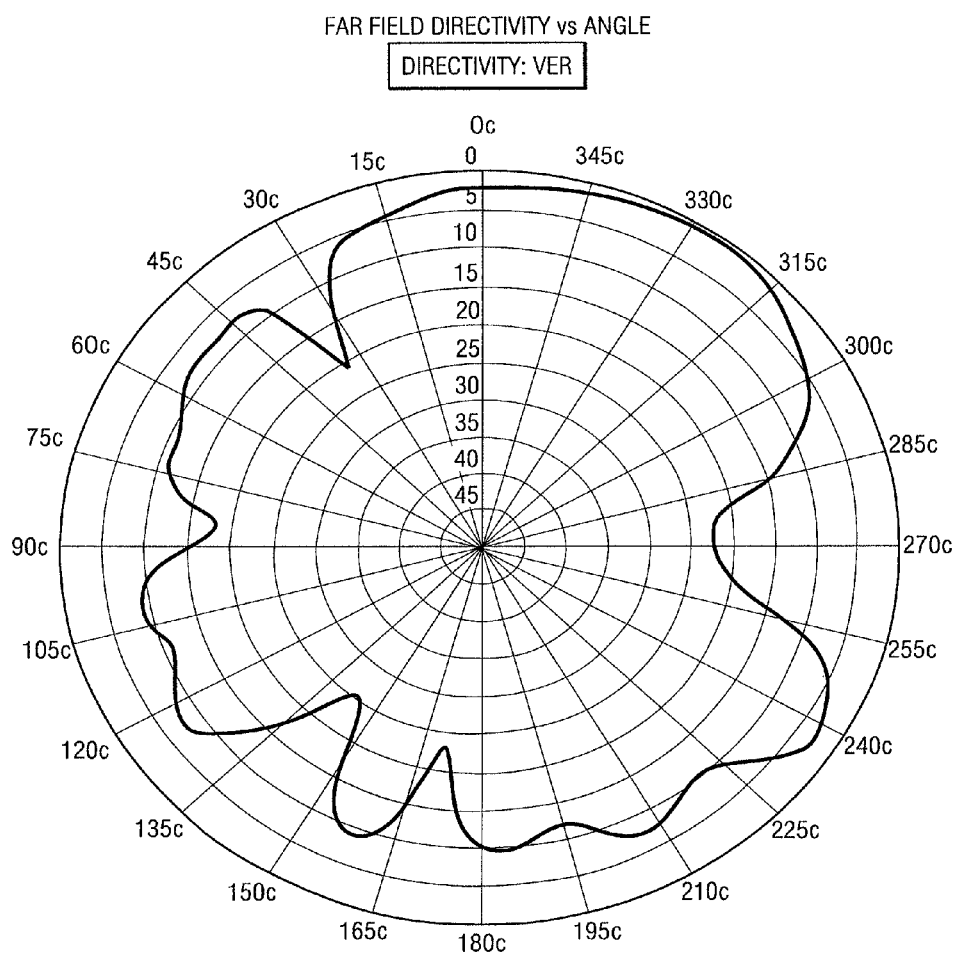
FIGS. 19A and 19B are polar plots showing simulated (FIG. 19A) and measured (FIG. 19B) results for the whip antenna directivity for the horizontal polarization.
Figure 19B:
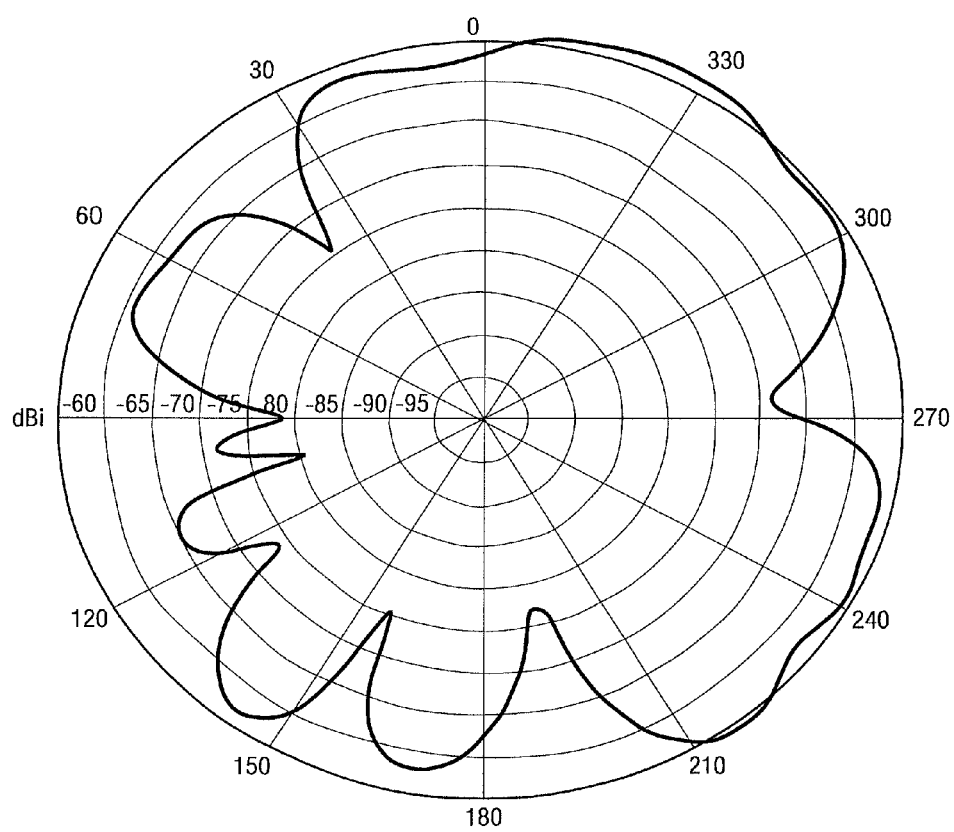

FIGS. 19A and 19B are polar plots showing simulated (FIG. 19A) and measured (FIG. 19B) results for the whip antenna directivity for the horizontal polarization. From the simulation results shown in FIGS. 18A and 19A, satisfactory agreement between simulation and measurements shown in FIGS. 18B and 19B for both vertical and horizontal polarizations result. As shown in the plots of FIGS. 18A-19B, a signal received by the whip antenna from the front is less than from the rear for vertical polarization. The opposite is true for horizontal polarization (i.e., the signal received is higher from the front than from the rear for vertical polarization). So, from the indication of the directivity results, it is expected that range from a rear part of a vehicle is larger if a key fob orientation is vertical and range is larger from the front of a vehicle if key fob orientation is horizontal.

The previous detailed description is of a small number of embodiments for implementing the invention and is not intended to be limiting in scope. One of skill in this art will immediately envisage the methods and variations used to implement this invention in other areas than those described in detail. The following claims set forth a number of the embodiments of the invention disclosed with greater particularity.

What is claimed:

1. A splitter for separating signals received from radio and remote keyless entry antennas, said splitter comprising:
   a first branch including a first filter to filter AM band signals from communications signals received from an antenna;
   a second branch including a second filter to filter FM band signals from communications signals received from the antenna;
   a third branch including a third filter to filter remote keyless entry signals from communications signals received from the antenna; and
   an amplifier to amplify the remote keyless entry signals, wherein the first and second branches further include amplifiers to amplify the respective AM band and FM band signals, the antenna is a roof antenna that is configured with multiple antennas, a first antenna for receiving the AM band and FM band signals and a second antenna for receiving the remote keyless entry signals and the first and second branches are configured to be connected to a first electrical conductor connected to the first antenna and the third branch is configured to be connected to a second electrical conductor connected to the second antenna.

2. The splitter according to claim 1, wherein the first, second, and third filters are passive filters.

3. The splitter according to claim 1, wherein the first, second, and third branches are configured to be connected to an electrical conductor connected to both the first and second antennas.

4. The splitter according to claim 1, wherein the antenna is a whip antenna.

* * * * *